(12) United States Patent
Sutskover et al.

(10) Patent No.: US 7,023,936 B2
(45) Date of Patent: Apr. 4, 2006

(54) METHOD AND APPARATUS FOR DECODING LATTICE CODES AND MULTILEVEL COSET CODES

(75) Inventors: Ilan Sutskover, Hadera (IL); Yaron Shany, Kfar Saba (IL); David Ben-Eli, Modiin (IL)

(73) Assignee: Intel Corporation, Santa Clara, CA (US)

( * ) Notice: Subject to any disclaimer, the term of this patent is extended or adjusted under 35 U.S.C. 154(b) by 877 days.

(21) Appl. No.: 10/046,590

(22) Filed: Oct. 29, 2001

(65) Prior Publication Data

US 2003/0081691 A1    May 1, 2003

(51) Int. Cl.
   *H03D 1/00*    (2006.01)
   *H04L 27/06*   (2006.01)
(52) U.S. Cl. .............. 375/341; 375/286; 375/262; 714/794; 714/810
(58) Field of Classification Search ........... 375/286, 375/285, 341, 262, 265; 714/794, 795, 810
See application file for complete search history.

(56) References Cited

U.S. PATENT DOCUMENTS 4,933,956 A * 6/1990 Forney, Jr. .............. 375/341
6,145,114 A   11/2000 Crozier et al.

FOREIGN PATENT DOCUMENTS

EP    0237186    9/1987

OTHER PUBLICATIONS

Sklar, "Digital Communications Fundamentals and Applications", published by Prentice Hall PTR, year 2000, pp. 347-248, 395-396.*

Banihashemi, A.H., et al., "Tanner Graphs for Group Block Codes and Lattices: Construction and Complexity", *IEEE Trans. On Information Theory*, vol. 47, No. 2, pp. 822-834, (Feb., 2001).

Forney, G.D., "Codes on Graphs: Normal Realizations", *IEEE Trans. On Information Theory*, vol. 47, No. 2, pp. 520-548, (Feb., 2001).

Forney, G.D., "Coset Codes—Part I: Introduction and Geometrical Classification", *IEEE Trans. On Information Theory*, vol. 34, No. 5, pp. 1123-1151, (Sep., 1988).

Forney, G.D., et al., "Multidimensional Constellations—Part I: Introduction, Figures of Merit, and Generalized Cross Constellations", *IEEE Journal of Selected Areas in Communications*, vol. 7, No. 6, pp. 877-892, (Aug., 1989).

(Continued)

*Primary Examiner*—Phuong Phu
(74) *Attorney, Agent, or Firm*—Schwegman, Lundberg, Woessner & Kluth, P.A.

(57) ABSTRACT

Some embodiments of the present invention include a decoding system in which the decoding system uses iterative decoding techniques to decode signals encoded with lattice codes and/or multilevel coset codes. The decoding techniciucs according to some embodiments of the invention may be less complex than some decoding techniciues such as maximum likelihood decoding techniciues. Other embodiments of the prevent invention are described and claims.

32 Claims, 4 Drawing Sheets

OTHER PUBLICATIONS

Fazel, K., et al., "Combined Multilevel Turbo-Code with 8PSK Modulation", *IEEE Global Telecommunications COnference*, (Nov. 13, 1995), pp. 649-653.

Martin, P. A., et al., "On Iterative Multistage Decoding", *2nd International Symposium on Turbo Codes& Related Topics*, Brest, France, (Sep. 4, 2000), pp. 407-410.

Wachsmann, U., et al., "Multilevel Codes: Theoretical Concepts and Practical Design Rules", *IEEE Transactions on Information Theory, 45*, (Jul. 5, 1999), pp. 1361-1391.

"Written Opinion in corresponding PCT Application No. PCT/IB02/04491", (Feb. 28, 2005), 5 pgs.

* cited by examiner

METHOD AND APPARATUS FOR DECODING LATTICE CODES AND MULTILEVEL COSET CODES

FIELD

The invention relates generally to signal decoding and, more particularly, to the decoding of signals that are encoded with lattice codes and/or multilevel coset codes.

BACKGROUND

Maximum likelihood decoding represents an optimal solution for the decoding of signals encoded with multilevel coset codes and/or lattice codes. However, maximum likelihood decoding is not practical in many cases. For example, maximum likelihood decoding may not be practical when a code has a complex trellis. A complex trellis may exist, for example, when the number of constituent codes within a multilevel coset code or lattice code is large or when the minimal trellis of the constituent code(s) is large. Complex trellises are typically difficult to store (and draw) and, when maximum likelihood decoding is used, require a very large number of calculations to implement at the decoding stage. For this reason, decoding solutions are needed for multilevel coset codes and lattice codes that are less computationally complex than maximum likelihood decoding techniques.

DETAILED DESCRIPTION

Figure 1:
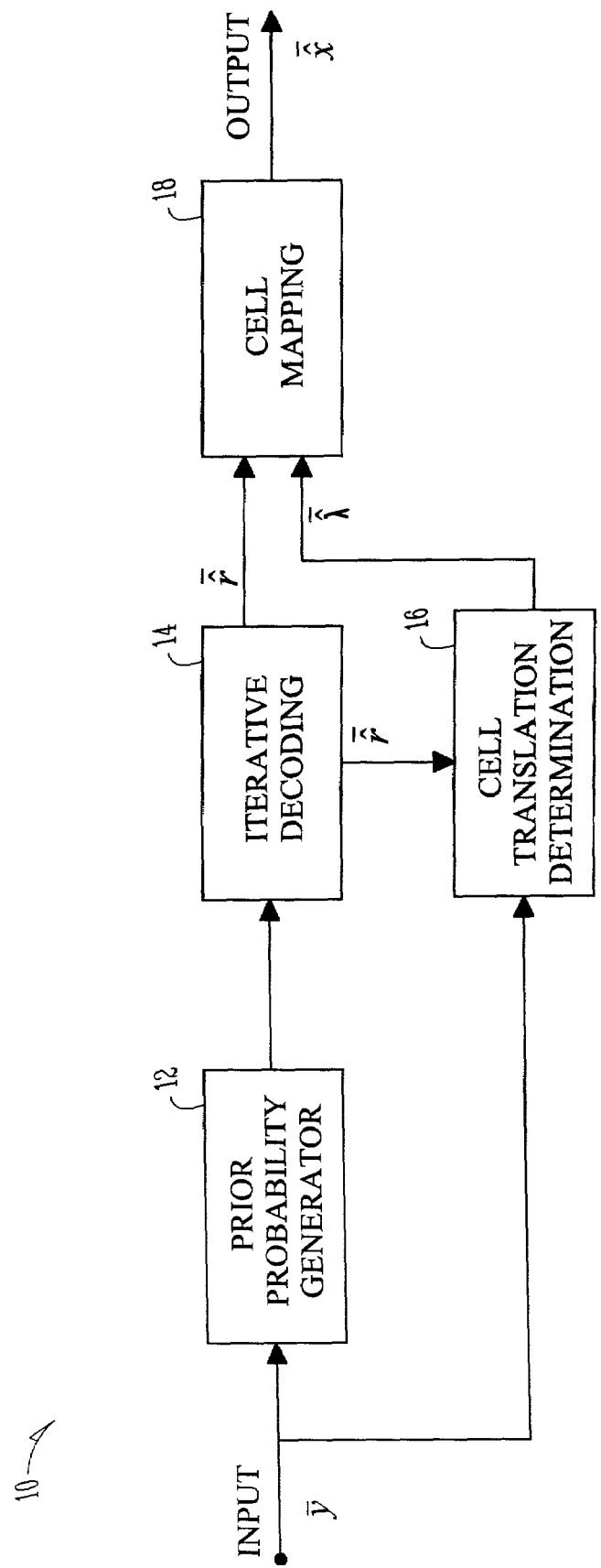
FIG. 1 is a block diagram illustrating a decoding system in accordance with an embodiment of the present invention.

In the following detailed description, reference is made to the accompanying drawings that show, by way of illustration, specific embodiments in which the embodiments of the invention may be practiced. These embodiments are described in sufficient detail to enable those skilled in the art to practice the embodiments of the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to methods and structures for decoding signals encoded with multilevel coset codes and/or lattice codes using iterative decoding techniques. The inventive techniques are significantly less computationally complex than optimal decoding solutions (e.g., maximum likelihood decoding) yet are capable of performance levels that approach those of the optimal methods. Because of the low complexity, the inventive techniques are especially valuable for use with codes having high dimensionality. In one embodiment, a data word received through a modulo lattice additive noise channel is treated as the sum of a multicode codeword and an interferer. The statistics of the interferer are used to determine prior probabilities associated with the multicode codeword. Iterative decoding techniques are then used to decode the individual constituent codes of the multicode codeword using the prior probabilities. The iterative decoding process may include, for example, the exchange of information (e.g., extrinsic information) between a number of constituent decoders. After the multicode codeword has been decoded, a cell translation is determined and used to map the multicode codeword to an appropriate underlying lattice cell. As used herein, the term "multicode" refers to the set of codewords of a multilevel coset code (or lattice code) that are within the base cell of an underlying lattice and the term "multicode codeword" will refer to a single codeword of the multicode. The inventive principles have application in communication systems and other systems using multilevel coset codes and/or lattice codes.

A lattice must satisfy several rules; namely, it is closed under addition, it contains an inverse element for each lattice element, it contains the zero element (i.e., the origin of the coordinate axes is a point of the lattice), and it is discrete. Therefore, a lattice is a discrete infinite collection of points that is created by the repetition of a base or unit cell throughout space. A lattice code is a finite subset of a lattice. As such, a lattice code may be defined as the intersection of a lattice with a region of bounded support. A decoding rule that ignores the effect of a bounding region is referred to as lattice decoding. Other decoding rules exist that take the bounding region into account (e.g., minimum distance decoding). The inventive principles may be used in connection with both lattice decoding and minimum distance-like decoding techniques.

Lattices can be constructed from one or more individual codes in a number of different ways (see, e.g., "Sphere Packings, Lattices and Groups" by J. H. Conway et al., pages 137–156 and 232–236, Springer-Verlag, New York, 1999). In one approach, for example, a point $x=(x_1, x_2, \ldots, x_n)$ is considered a lattice point if it is congruent modulo 2 to a codeword of a binary linear code C. Such a lattice will be referred to herein as a "construction A" lattice. A construction A lattice can be expressed mathematically as follows:

$$\Lambda_n = C + 2Z^n$$

where C is a binary code of length n, n is the number of coordinates of each point of the lattice, and $2Z^n$ is a lattice that translates the points of code C to form the lattice $\Lambda_n$ (Z being the set of integers). As used herein, the lattice $2Z^n$ will be referred to as the underlying lattice of lattice $\Lambda_n$. The codewords of code C each occur within a base cell (i.e., a cell that includes the origin) of the underlying lattice. A more general lattice construction, referred to herein as construction D, can be expressed as:

$$\Lambda_n = C_1 + 2C_2 + 4C_3 + \ldots + 2^{k-1}C_k + 2^k Z^n$$

where constituent codes $\{C_i\}_{i=1}^k$ are linear binary codes that are nested (i.e., a codeword of $C_i$ is also a codeword of $C_{i+1}$), k is the number of constituent codes, and $2^k Z^n$ is the underlying lattice that translates the points of multicode $(C_1+2C_2+4C_3+\ldots+2^{k-1}C_k)$ to form the lattice $\Lambda_n$. As described previously, the codewords of the multicode $(C_1+2C_2+4C_3+\ldots+2^{k-1}C_k)$ occur within a base cell of the underlying lattice $2^k Z^n$. For a single constituent code, the construction D lattice reduces to the construction A lattice described above. The value of the translations in each of the above equations can be the same or different for each of the n coordinates.

A coset code is a code of infinite codebook size that can be expressed as follows:

$$C = C_0 + (\Lambda_1)^n$$

where $\Lambda \supseteq \Lambda_1$ are lattices, $[\Lambda/\Lambda_1]$ is a finite complete set of coset representatives of $\Lambda_1$ in $\Lambda$, and $C_0 \subseteq ([\Lambda/\Lambda_1])^n$ is a code. The lattice $(\Lambda_1)^n$ in the above equation is the underlying lattice that translates the points of code $C_0$ to form the coset code C. A multilevel coset code is a code of infinite codebook size that can be written as:

$$C = C_1 + C_2 + C_3 + \ldots + C_k + (\Lambda_{k+1})^n$$

where $\Lambda \supseteq \Lambda_1 \supseteq \Lambda_2 \supseteq \ldots \supseteq \Lambda_{k+1}$ are lattices and $C_k \subseteq ([\Lambda_k/\Lambda_{k+1}])^n$, $C_{k-1} \subseteq ([\Lambda_{k-1}/\Lambda_k])^n$, ..., and $C_1 \subseteq ([\Lambda/\Lambda_1])^n$. The points of the multicode $(C_1+C_2+C_3+\ldots+C_k)$ occur within the base cell of the underlying lattice $(\Lambda_{k+1})^n$. The underlying lattice $(\Lambda_{k+1})^n$ translates the points of the multicode $(C_1+C_2+C_3+\ldots+C_k)$ to form the multilevel coset code C. The lattice $(\Lambda_{k+1})^n$ can be replaced by a direct product $\Lambda_{k+1}^{(1)} \times \Lambda_{k+1}^{(2)} \times \ldots \times \Lambda_{k+1}^{(n)}$ to create a time varying multilevel coset code. For $\Lambda_{k+1} = 2^k Z$ and $C_i = 2^{i-1} \hat{C}_i$ (where the $\hat{C}_i$'s are nested linear binary codes), the multilevel coset code C is reduced to a construction D lattice. Thus, the construction D lattice is one form of multilevel coset code. Multilevel coset codes differ from construction D lattices in two primary areas: namely, (1) the nesting property of constituent codes of a construction D lattice is not required for a multilevel coset code, and (2) the constellation used by a multilevel coset code does not need to be one dimensional (i.e., $\Lambda_{k+1}$ need not be isomorphic to Z). In the discussion that follows, the inventive principles are most often described in general terms in the context of a multilevel coset code. It should be appreciated, however, that the inventive principles are equally applicable to construction A and construction D lattices as well as other lattice types.

FIG. 1 is a block diagram illustrating a decoding system 10 in accordance with an embodiment of the present invention. The decoding system 10 receives an input word $\bar{y}=(y_1, y_2, \ldots, y_n)$ that has traveled through, for example, a noisy communication channel. Using the input word, the decoding system 10 must determine the corresponding codeword $\bar{x}=(x_1, x_2, \ldots, x_n)$ that was originally transmitted into the channel. The codeword $\bar{x}$ will be a valid codeword of a multilevel coset code being used within the system. The codeword $\bar{x}$ will include components from each of the constituent codes $(\bar{c}_1, \bar{c}_2, \ldots, \bar{c}_k)$ of the multilevel coset code as well as a translation term $\bar{\lambda}$ that translates the word to an appropriate lattice cell. While propagating through the channel, the codeword $\bar{x}$ is acted upon by an interference signal $\bar{s}=(s_1, s_2, s_n)$ that modifies the codeword in an additive manner. This process can be expressed as follows:

$$\bar{y} = \bar{x} + \bar{s} = (\bar{c}_1 + \bar{c}_2 + \ldots + \bar{c}_k + \bar{\lambda}) + \bar{s}$$

where $\bar{c}_1 \in C_1$, $\bar{c}_2 \in C_2$, ..., $\bar{c}_k \in C_k$, and $\bar{\lambda} \in (\Lambda_{k+1})^n$. The interference signal $\bar{s}$ can include, for example, additive white Gaussian noise (AWGN) having a well known probability density function. By rearranging the terms in the above equation, the input word $\bar{y}$ can be expressed as follows:

$$\bar{y} = (\bar{c}_1 + \bar{c}_2 + \ldots + \bar{c}_k) + (\bar{\lambda} + \bar{s}) = \bar{r} + \bar{w}$$

where $\bar{r} = (\bar{c}_1 + \bar{c}_2 + \ldots + \bar{c}_k)$ is a multicode codeword and $\bar{w} = \bar{\lambda} + \bar{s}$ is treated as an interferer. As will be described in greater detail, in one approach, the multicode codeword $\bar{r}$ is first decoded using an iterative decoding technique and the translation $\bar{\lambda}$ is then determined and used to map the multicode codeword $\bar{r}$ to an appropriate cell of the underlying lattice.

As illustrated in FIG. 1, the decoding system 10 includes: a prior probability generator 12, an iterative decoding unit 14, a cell translation determination unit 16, and a cell mapping unit 18. It should be appreciated that the individual blocks illustrated in FIG. 1 are functional in nature and do not necessarily correspond to discrete hardware elements. For example, in one embodiment of the present invention, one or more (or all) of the functional blocks are implemented in software within one or more digital processing units (e.g., a general purpose microprocessor, a digital signal processor (DSP), a reduced instruction set computer (RISC), a complex instruction set computer (CISC), a field programmable gate array (FPGA), and/or others). Full or partial hardware implementations are also possible.

Using the input word $\bar{y}$, the prior probability generator 12 generates probabilities for each of the constituent codes of the corresponding multilevel coset code. When the statistics of the interferer $\bar{s}$ are known (e.g., probability density function), these statistics may be used to determine the prior probabilities. As will be described later, techniques are also provided for determining the prior probabilities when the statistics of the interferer are not known. The iterative decoding unit 14 is operative for decoding the constituent code(s) of the multicode codeword $\bar{r}$ using iterative decoding techniques. The iterative decoding unit 14 uses the prior probabilities generated by the prior probability generator 12 to initialize the iterative process. The cell translation determination unit 16 determines the translation $\bar{\lambda}$ of the codeword $\bar{x}$ based on the input word $\bar{y}$ and the multicode codeword $\bar{r}$ determined by the iterative decoding unit 14. The cell mapping unit 18 then maps the multicode codeword $\bar{r}$ to an appropriate lattice cell based on the translation $\bar{\lambda}$ determined by the cell translation determination unit 16 to output the codeword $\bar{x}$.

In iterative decoding, there are typically two types of information concerning a bit of a codeword, information that depends on that bit's channel observation and information that depends on the channel observation of other bits that reflects to the subject bit due to the nature of the code. The latter type of information is referred to as "extrinsic information."

In one embodiment of the present invention, the prior probability generator 12 determines the probabilities that each coordinate of each constituent code has a predetermined binary value (e.g., zero) based on the content of the input word $\bar{y}$ and the statistics of the interferer $\bar{s}$. In one such approach, a set $S^{(m)}$ is first defined as the set of all symbols r whose mth coordinate in the binary representation is zero. For example, if $r = c_1 + 2c_2 \in \{0,1,2,3\}$ then $S^{(1)} = \{0,2\}$ and $S^{(2)} = \{0,1\}$. The set $S_i^{(m)}$ is then defined as the set $S^{(m)}$ that corresponds to the symbol at time instant i (i.e., $r_1$). The prior probability that the ith time coordinate of the mth constituent code is zero is then given by:

$$\frac{\sum_{\eta \in S_i^{(m)}} \sum_{\lambda_1 \in \Lambda_{k+1}} P(y_i + \lambda_i \mid r_i = \eta) P(\lambda_i \mid r_i = \eta)}{\sum_{\eta} \sum_{\lambda_1 \in \Lambda_{k+1}} P(y_i + \lambda_i \mid r_i = \eta) P(\lambda_i \mid r_i = \eta)}$$

It should be appreciated that the expression $P(y+\lambda|r)$ refers to a probability function when the alphabet is discrete and a density function when the alphabet is continuous. For lattice decoding, when it is assumed that all translations are legal, the probability $P(\lambda_i|r_i=\eta)$ is deemed a constant and the above equation reduces to:

$$\frac{\sum_{\eta \in S_i^{(m)}} \sum_{\lambda_1 \in \Lambda_{k+1}} P(y_i + \lambda_i \mid r_i = \eta)}{\sum_{\eta} \sum_{\lambda_1 \in \Lambda_{k+1}} P(y_i + \lambda_i \mid r_i = \eta)}$$

In one implementation, the above summations are truncated to include only the most significant terms. In the discussion above, the prior probabilities are expressed as conventional probabilities. It should be appreciated that the prior probabilities can be expressed in any of a number of alternative maimers in accordance with the embodiments of the invention including, for example, likelihood ratios, log likelihood ratios (LLRs), probability differences, and other similar formats.

Figure 2:
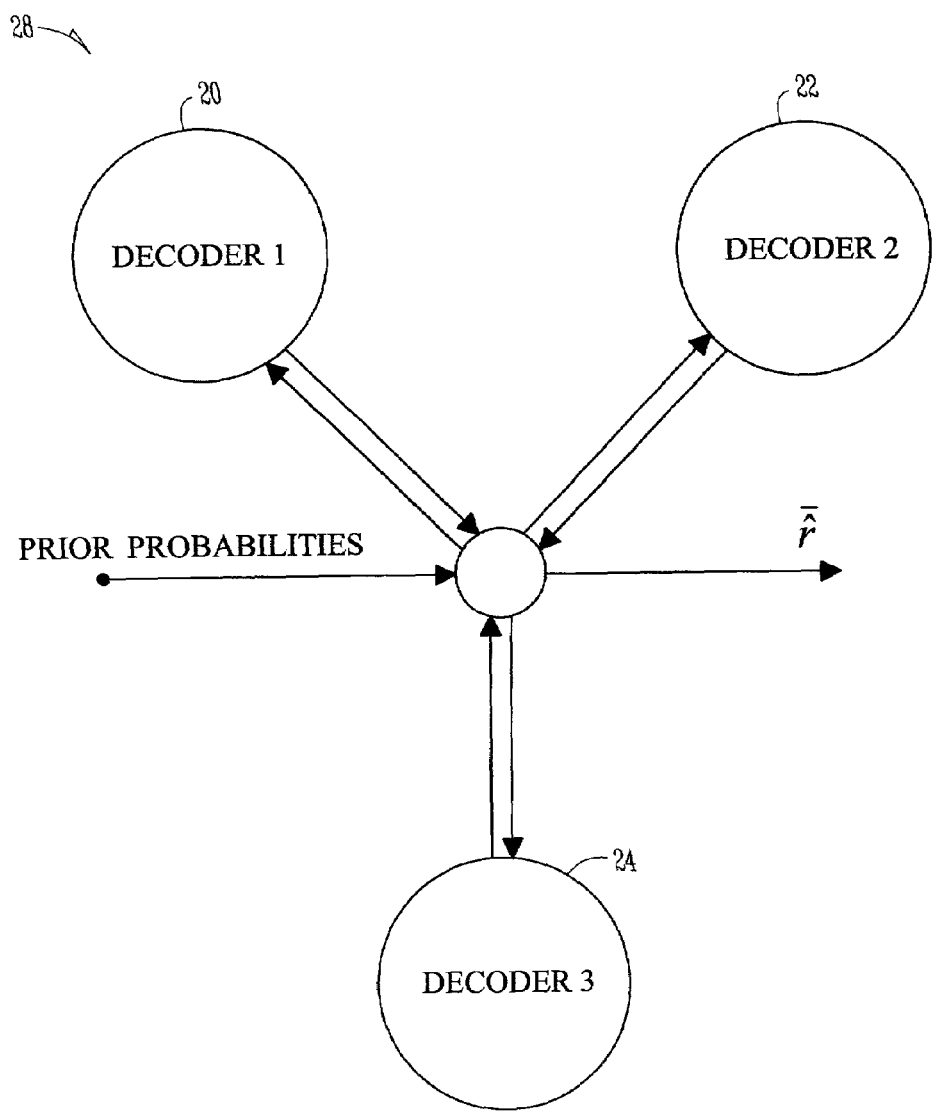
FIG. 2 is a diagram illustrating an iterative decoding unit in accordance with an embodiment of the present invention.

In at least one embodiment of the present invention, the iterative decoding unit 14 includes a separate decoder for each of the constituent codes of the multilevel coset code. Each of these constituent decoders will preferably be a soft in, soft out (SISO) decoder that accepts soft information at an input and uses it to generate soft information at an output that is indicative of the reliability of the decoder's decisions. FIG. 2 is a diagram illustrating an iterative decoding unit 28 that may be used in the system 10 of FIG. 1. As illustrated, the iterative decoding unit 28 includes first, second, and third constituent decoders 20, 22, 24 (DECODER 1, DECODER 2, and DECODER 3, respectively) that are each used to decode a corresponding one of the constituent codes of a multilevel coset code. Each of the constituent decoders 20, 22, 24 receives corresponding prior probabilities generated by the prior probability generator 12. The constituent decoders 20, 22, 24 process this input information to generate, among other things, soft information at corresponding outputs. The constituent decoders 20, 22, 24 then exchange soft information (e.g., extrinsic information) among each other and another round of processing is performed using the new information. Several or more rounds of such iterative processing will typically be performed to repeatedly refine and update the decisions of the individual decoders 20, 22, 24. In at least one embodiment, a predetermined number of iterations is performed. In another approach, the number of iterations is made dependent on the decoder outputs. Eventually, each of the constituent decoders 20, 22, 24 outputs a best estimate (either a soft or hard decision) of a corresponding portion of the output multicode codeword. An estimate of the multicode codeword (i.e., $\tilde{r}$) is subsequently output from the iterative decoding unit 28.

The iterative decoding unit 28 may include any number of constituent decoders. The individual constituent decoders 20, 22, 24 of the iterative decoding unit 28 may also take many forms. For example, in at least one embodiment, one or more of the constituent decoders 20, 22, 24 is an iterative decoder itself. Some iterative decoder types that can be used include, for example, turbo decoders and low density parity check (LDPC) decoders. For each iteration of the iterative decoding unit 28, an iterative constituent decoder can perform one or more of its own iterations. The iterative constituent decoder can then output, for example, posterior LLR's (or hard decisions) as well as extrinsic information for distribution to the other constituent decoders. Non-iterative constituent decoders can also be used (e.g., maximum a posteriori (MAP) decoders, forward-backward algorithm decoders, soft output Viterbi algorithm decoders, etc.). Non-iterative constituent decoders may also output posterior LLR's (or hard decisions) and extrinsic information for the other constituent decoders. The constituent decoders 20, 22, 24 can all be of the same type or different decoder types can be used. In one embodiment of the present invention, the information delivered to the mth constituent decoder (for the ith time coordinate) prior to a subsequent iteration includes the following probability:

$$P(c^m = 0 \mid \bar{y}) \equiv \frac{\sum_{\eta \in S^{(m)}} P(y \mid r = \eta) \prod_{j \neq m} \hat{P}(c^j = D^j(\eta))}{\sum_{\eta} P(y \mid r = \eta) \prod_{j \neq m} \hat{P}(c^j = D^j(\eta))}$$

where $D^{(j)}(\eta)$ is the value of the codeword of the jth constituent code, $c^j$, at the ith time coordinate, if $\eta$ is the value of the multicode, and $\hat{P}(c^j=\alpha)$ is the posterior information received from the jth decoder. For the sake of brevity, dependence on i has been omitted in the above equation.

Referring back to FIG. 1, when a multilevel coset code having only a single constituent code is used (e.g., a construction A lattice), the iterative decoding unit 14 will typically include only a single iterative decoder. As can be appreciated, there is no exchange of information between constituent decoders in such an arrangement, merely feedback of information from an output of a decoder to an input thereof.

The cell translation determination unit 16 uses the multicode codeword estimate $\tilde{r}$ output by the iterative decoding unit 14 and the input word $\bar{y}$ to determine the translation (e.g., $\bar{\lambda} \in (\Lambda_{k+1})^n$) associated with the input word $\bar{y}$. In one approach, the translation is found by determining arg max$_{\bar{\lambda}}$P($\bar{\lambda}|\bar{y},\tilde{r}$). On some occasions, this expression reduces to arg min $_{\bar{\lambda}}\|\bar{\lambda}-(\bar{y}-\tilde{r})\|_2$. The cell mapping unit 18 subsequently maps the multicode codeword $\tilde{r}$ to the appropriate lattice cell using the estimated translation $\hat{\lambda}$. The cell mapping unit 18 may output either hard or soft values.

As an example of the operation of the decoding system 10 of FIG. 1, assume that the number of coordinates of each lattice point of a code is 3 (i.e., n=3) and the number of constituent codes of the code is 2 (i.e., k=2). Also assume that the first constituent code $C_1$ includes codewords (000) and (111) and the second constituent code $C_2$ includes codewords (000), (011), (101), and (110). Note that these example codes are for illustrative purposes only and may not represent actual codes (e.g., the codes are not nested). Further assume that the input word received from the channel is $\bar{y}=(5.6\ 7\ -1)$. The lattice point $\bar{x}$ that needs to be determined is expressed as:

$$\bar{x}=\bar{c}_1+2\bar{c}_2+4Z^n.$$

The iterative decoding unit 14 decides that $\bar{c}_1=(1\ 1\ 1)$ and $\bar{c}_2=(0\ 1\ 1)$. Thus, $\tilde{r}=([1+2(0)][1+2(1)][1+2(1)])=(1\ 3\ 3)$. To determine the estimated translation $\hat{\lambda}$, it is first determined that $(\bar{y}-\tilde{r})=([5.6-1][7-3][-1-3])=(4.6\ 4\ -4)$. The vector is then compared to the possible values of $4Z^n$ and it is determined that the appropriate translation $\hat{\lambda}$ is $(4\ 4\ -4)$ (i.e., $\arg\min_{\bar{\lambda}}\|\bar{\lambda}-(\bar{y}-\tilde{r})\|_2$). The output $\bar{x}$ is thus determined to be $\tilde{r}+\hat{\lambda}=([1+4]\ [3+4]\ [3-4])=(5\ 7\ -1)$.

Figure 3:
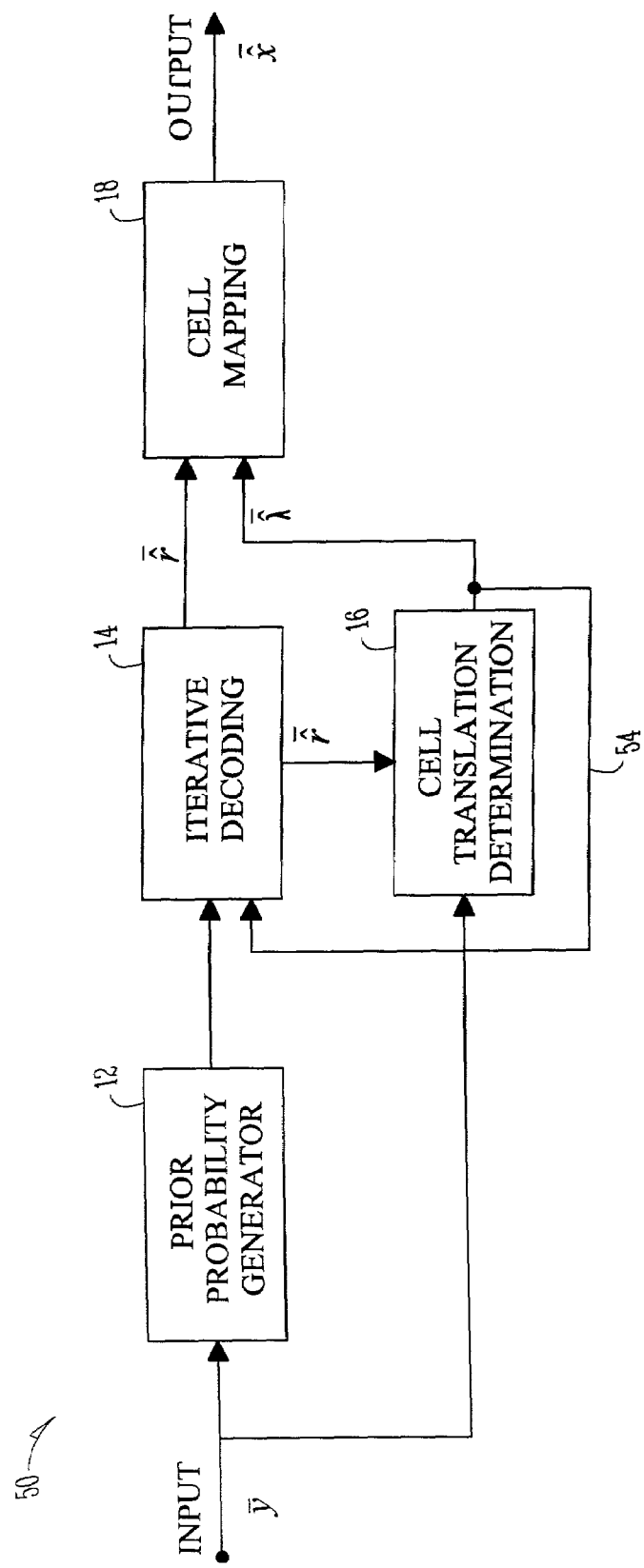
FIG. 3 is a block diagram illustrating a decoding system that is adapted to perform turbo iterations in accordance with an embodiment of the present invention.

In at least one embodiment of the present invention, turbo iterations are performed. That is, instead of determining $\tilde{r}$ and $\hat{\lambda}$ once before generating the output word $\bar{x}$, a number of iterations are performed with each iteration further refining the previous one. FIG. 3 is a block diagram illustrating a decoding system 50 that is adapted to perform turbo iterations in accordance with an embodiment of the present invention. As shown, a feedback loop 54 has been added to feed back information relating to present values of $\hat{\lambda}$ to an input of the iterative decoding unit 14 for use in generating updated versions of $\tilde{r}$ and then $\hat{\lambda}$. As before, a predetermined number of iterations can be performed or the number of iterations can be output dependent.

In the above description, it was assumed that the statistics of the interferer $\bar{s}$ were known. When no such statistical characterization of the interferer exists, however, other means for initializing the iterative process need to be developed. If a minimum Euclidean distance criterion is being used (i.e., the multilevel coset code point that is closest to $\bar{y}$ in Euclidean distance is sought), then a number of initialization strategies are possible. In one approach, for example, it is assumed that the interferer has a Gaussian distribution with zero mean and unknown variance $\sigma^2$. The Gaussian distribution is an explicit function of Euclidean distance. In another approach, it is assumed that the interferer is uniformly distributed within a Voronoi cell of the underlying lattice. In an approximation of this approach, it can be assumed that the Voronoi cell of $\Lambda_{k+1}$ is a v-dimensional ball of radius R. In a high dimensionality lattice, this will typically be a good approximation. The volume of the ball is denoted $V_v(R)$ and it is known that $V_v(R)=R^v\times\text{constant}$. Therefore, $$P(s^2\le\alpha)=\left(\frac{\alpha}{R}\right)^v$$

and the probability density function of the interferer squared distance is given by $$(v-1)\frac{\alpha^{v-1}}{R^v}.$$

If this approach is used, the log likelihood ratios are independent of the radius R. Therefore, the iterative algorithm does not need to know the value of R. As the exact value of R may be unknown, this is a very favorable result.

Figure 4:
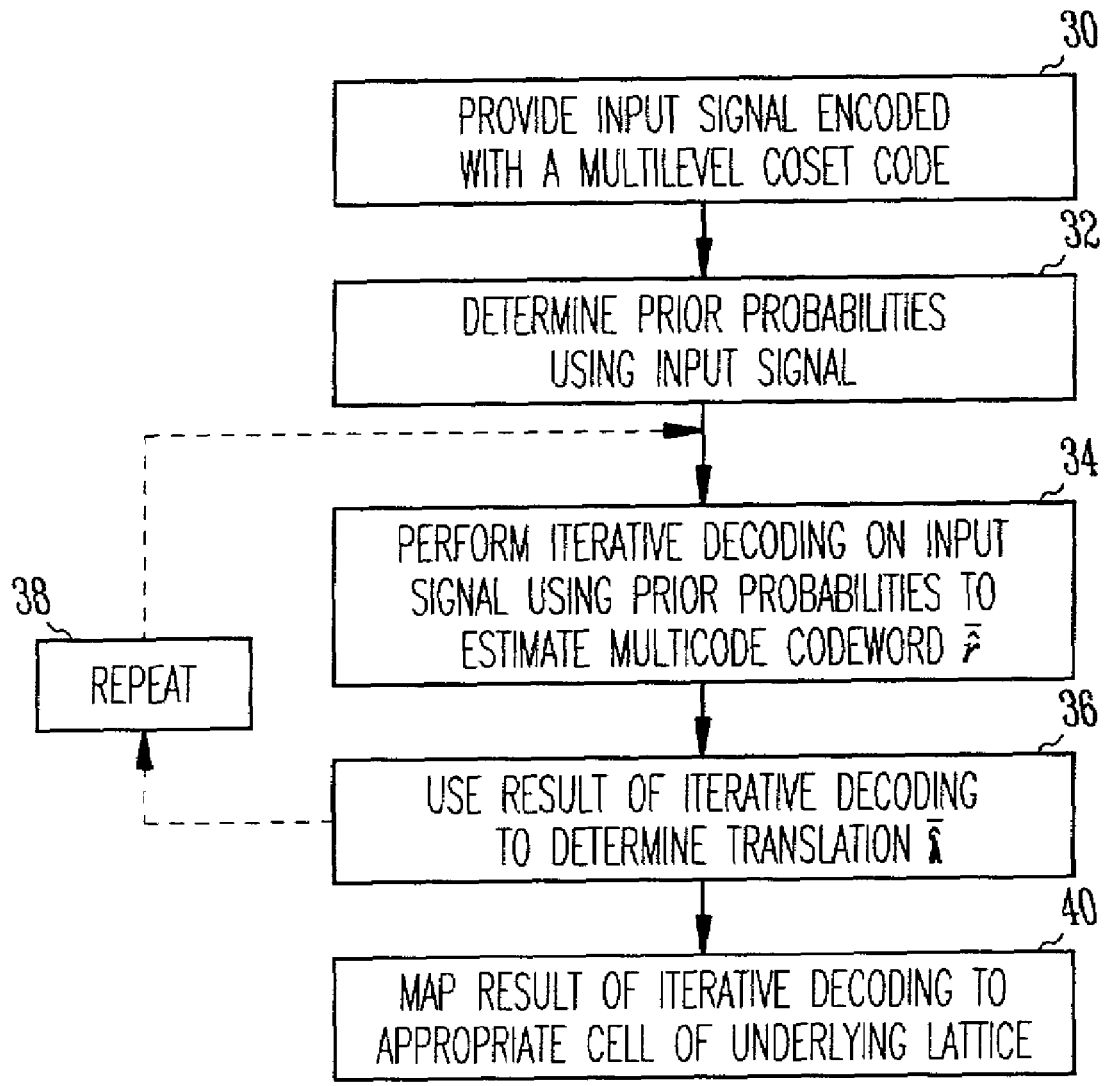
FIG. 4 is a flowchart illustrating a method for decoding a signal in accordance with an embodiment of the present invention.

FIG. 4 is a flowchart illustrating a method for decoding a signal in accordance with an embodiment of the present invention. Some or all of the method may be implemented and/or distributed as a software program stored on, for example, a computer readable medium (e.g., a compact disk read only memory (CDROM), floppy disk, tape, semiconductor memory, etc.). Similarly, some or all of the method may be implemented within an application specific integrated circuit (ASIC) or other digital circuit). First, an input signal is received that is encoded with a multilevel coset code (block 30). Prior probabilities are next determined using the input signal (block 32). Statistics associated with an interferer may also be used to determine the prior probabilities. In one approach, the statistics of the interferer are known. In another approach, statistics are assumed for the interferer. For example, as described above, it can be assumed that the interferer is uniformly distributed within a Voronoi cell that is an n-dimensional ball of radius R. Other techniques are also possible.

Once the prior probabilities have been determined, they are used to initialize an iterative decoding process for the input signal to estimate a multicode codeword $\tilde{r}$ (block 34). If multiple constituent codes are involved, the iterative decoding process may involve the exchange of information among individual constituent decoders during two or more iterative cycles. A translation estimate $\hat{\lambda}$ is next determined for the input signal based on the result of the iterative decoding process (block 36). Optionally, the translation and estimated multicode codeword can be used to further refine the result of the iterative decoding process in one or more additional iterative cycles (block 38). The translation is eventually used to map the result of the iterative decoding process to an appropriate cell of the underlying lattice (block 40).

It should be appreciated that the principles of the embodiments of the present invention are not limited to use within communication systems. For example, any application that relies on vector quantization (e.g., speech or image compression) may benefit from the use of reduced complexity lattice decoders in accordance with the present invention. Other non-communications based applications are also possible.

Although the embodiments of the present invention have been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A method for decoding a signal, comprising:
    determining prior probabilities associated with an encoded input signal;
    performing iterative decoding on said encoded input signal, using said prior probabilities, to estimate a codeword associated with said encoded input signal, said codeword being within a base cell of an underlying lattice, wherein said encoded input signal is coded with a code having at least one constituent code, and wherein performing iterative decoding includes exchanging information between a plurality of constituent decoders during at least two iterative cycles when said encoded input signal includes multiple constituent codes; and
    determining a cell translation associated with said encoded input signal based on said codeword.

2. The method of claim 1, further comprising: mapping said codeword to an appropriate cell of said underlying lattice using said cell translation.

3. The method of claim 1, wherein:
said encoded input signal is coded with a multilevel coset code.

4. The method of claim 1, wherein:
said encoded input signal is coded with a lattice code.

5. The method of claim 1, wherein:
determining prior probabilities includes determining a probability that a first coordinate of a first constituent code has a predetermined value, based on said encoded input signal.

6. The method of claim 1, wherein:
said encoded input signal has been modified by an interferer; and
determining prior probabilities includes determining probabilities based upon statistics associated with said interferer.

7. The method of claim 6, wherein:
said statistics associated with said interferer are known.

8. The method of claim 6, wherein:
determining prior probabilities includes assuming statistics for said interferer for use in determining said probabilities.

9. The method of claim 8, wherein:
assuming statistics includes assuming that said interferer is uniformly distributed within a Voronoi cell of a lattice.

10. The method of claim 9, wherein:
assuming statistics includes assuming that said Voronoi cell is a ball.

11. The method of claim 1, wherein performing iterative decoding includes:
performing a first decoding iteration, using said prior probabilities, to generate first information; and
performing a second decoding iteration, using said first information, to generate second information.

12. A method for decoding a signal, comprising:
determining prior probabilities associated with an encoded input signal;
performing iterative decoding on said encoded input signal, using said prior probabilities, to estimate a codeword associated with said encoded input signal, said codeword being within a base cell of an underlying lattice, wherein performing iterative decoding includes exchanging information between a plurality of constituent; and
determining a cell translation associated with said encoded input signal based on said codeword.

13. The method of claim 12, wherein:
exchanging information between a plurality of constituent decoders includes exchanging extrinsic information.

14. A decoding system comprising:
a prior probability generator to generate prior probabilities associated with an encoded input signal;
an iterative decoding unit to determine a codeword associated with said encoded input signal by iterative decoding using said prior probabilities, said codeword being within a base cell of an underlying lattice, wherein said iterative decoding unit includes a plurality of constituent decoders, and wherein said constituent decoders are confi wired to exchanging information among said constituent decoders during said iterative decoding; and
a translation determination unit to determine a cell translation associated with said encoded input signal based on said codeword.

15. The decoding system of claim 14, further comprising:
a cell mapping unit to map said codeword to an appropriate cell of said underlying lattice using said cell translation.

16. The decoding system of claim 14, wherein:
said encoded input signal is coded with a multilevel coset code.

17. The decoding system of claim 14, wherein:
said encoded input signal is coded with a lattice code.

18. The decoding system of claim 14, wherein:
said constituent decoders are configured to decode constituent codes of said encoded input signal.

19. A decoding system comprising:
a prior probability generator to generate prior probabilities associated with an encoded input signal;
an iterative decoding unit to determine a codeword associated with said encoded input signal by iterative decoding using said prior probabilities, said codeword being within a base cell of an underlying lattice, said iterative decoding unit including multiple constituent decoders to decode constituent codes of said encoded input signal wherein said constituent decoders are configured to exchange soft information between one another during said iterative decoding; and
a translation determination unit to determine a cell translation associated with said encoded input signal based on said codeword.

20. The decoding system of claim 18, wherein:
at least one constituent decoder of said constituent decoders is an iterative decoder.

21. The decoding system of claim 18, wherein:
at least one constituent decoder that is a soft in, soft out (SISO) decoder.

22. The decoding system of claim 14, wherein:
said prior probability generator generates said prior probabilities based on known statistics associated with an interferer.

23. The decoding system of claim 14, wherein:
said prior probability generator assumes statistics for an interferer and generates said prior probabilities based on said assumed statistics.

24. The decoding system of claim 23, wherein:
said prior probability generator assumes that said interferer is uniformly distributed within a Voronoi cell of a lattice.

25. The decoding system of claim 24, wherein:
said prior probability generator assumes that said Voronoi cell is a ball.

26. The decoding system of claim 23, wherein:
said prior probability generator assumes that said interferer has a Gaussian distribution with zero mean and unknown variance.

27. An article comprising machine-accessible media having associated data, wherein the data, when accessed, results in a machine that performs a method for decoding a signal, said method comprising:
determining prior probabilities associated with an encoded input signal;
performing iterative decoding on said encoded input signal, using said prior probabilities, to estimate a codeword associated with said encoded input signal, said codeword being within a base cell of an underlying lattice, wherein said encoded input signal is coded with a code having at least one constituent code, and wherein performing iterative decoding includes exchanging information between a plurality of constituent decoders during at least two iterative cycles when said encoded input signal includes multiple constituent codes; and determining a cell translation associated with said encoded input signal based on said codeword.

28. The article of claim 27, wherein said method further comprises:

mapping said codeword to an appropriate cell of said underlying lattice using said cell translation.

29. The article of claim 27, wherein:

said encoded input signal is coded with a multilevel coset code.

30. The article of claim 27, wherein:

said encoded input signal is coded with a lattice code.

31. An article comprising machine-accessible media having associated data, wherein the data, when accessed, results in a machine that performs a method for decoding a signal, said method comprising:

determining prior probabilities associated with an encoded input signal;

performing iterative decoding on said encoded input signal, using said prior probabilities, to estimate a codeword associated with said encoded input signal, said codeword being within a base cell of an underlying lattice, wherein performing iterative decoding includes exchanging information between a plurality of constituent and decoders; and determining a cell translation associated with said encoded input signal based on said codeword.

32. The article of claim 31, wherein:

exchanging information includes exchanging extrinsic information between a plurality of constituent decoders.

* * * * *

UNITED STATES PATENT AND TRADEMARK OFFICE
CERTIFICATE OF CORRECTION

PATENT NO. : 7,023,936 B2
APPLICATION NO. : 10/046590
DATED : April 4, 2006
INVENTOR(S) : Sutskover et al.

It is certified that error appears in the above-identified patent and that said Letters Patent is hereby corrected as shown below:

On the title page, item (56), under "Foreign Patent Documents", in column 1, line 1, after "9/1987" insert - - H03M/13/00 - -.

On the title page, item (56), under "Other Publications", in column 2, line 6, delete "vol." and insert - - Vol. - -, therefor.

On the title page, item (56), under "Other Publications", in column 2, line 9, delete "vol." and insert - - Vol. - -, therefor.

On the title page, item (56), under "Other Publications", in column 2, line 13, delete "vol." and insert - - Vol. - -, therefor.

On the title page, item (56), under "Other Publications", in column 2, line 17, delete "vol." and insert - - Vol. - -, therefor.

On the title page, item (57), under "Abstract", in column 2, line 4-5, delete "techniciucs" and insert - - techniques - -, therefor.

On the title page, item (57), under "Abstract", in column 2, line 6, delete "techniciues" and insert - - techniques - -, therefor.

On the title page, item (57), under "Abstract", in column 2, line 7, delete "techniciucs" and insert - - techniques - -, therefor.

On the title page, item (57), under "Abstract", in column 2, line 8, delete "prevent" and insert - - present - -, therefor.

UNITED STATES PATENT AND TRADEMARK OFFICE
CERTIFICATE OF CORRECTION

PATENT NO. : 7,023,936 B2
APPLICATION NO. : 10/046590
DATED : April 4, 2006
INVENTOR(S) : Sutskover et al.

It is certified that error appears in the above-identified patent and that said Letters Patent is hereby corrected as shown below:

On the title page, item (57), under "Abstract", in column 2, line 8, delete "claims" and insert - - claimed - -, therefor.

In column 9, lines 45-46, in Claim 12, delete "constituent;" and insert - - constituent decoders; - -, therefor.

In column 9, line 52, in Claim 13, delete "infonnation." and insert - - information. - -, therefor.

In column 9, line 62, in Claim 14, delete "confi wired" and insert - - configured - -, therefor.

In column 12, line 9, in Claim 31, delete "and" before "decoders;".

Signed and Sealed this

Twenty-ninth Day of August, 2006

JON W. DUDAS
*Director of the United States Patent and Trademark Office*